United States Patent [19]

Mueller

[11] Patent Number: 5,909,388
[45] Date of Patent: Jun. 1, 1999

[54] DYNAMIC RANDOM ACCESS MEMORY CIRCUIT AND METHODS THEREFOR

[75] Inventor: Gerhard Mueller, Wappingers Falls, N.Y.

[73] Assignee: Siemens Aktiengesellschaft, Munich, Germany

[21] Appl. No.: 09/052,799

[22] Filed: Mar. 31, 1998

[51] Int. Cl.[6] .................................................. G11C 5/00
[52] U.S. Cl. ............................... 365/63; 365/51; 365/72; 365/230.03
[58] Field of Search .................................. 365/63, 52, 72, 365/149, 190, 230.03, 51; 257/208, 210

[56] References Cited

U.S. PATENT DOCUMENTS

| | | | |
|---|---|---|---|
| 5,541,130 | 7/1996 | Ogura et al. | 437/43 |
| 5,636,158 | 6/1997 | Kato et al. | 365/63 |
| 5,654,917 | 8/1997 | Ogura et al. | 365/185.18 |
| 5,681,770 | 10/1997 | Ogura et al. | 437/43 |
| 5,831,912 | 11/1998 | Mueller et al. | 365/51 |

*Primary Examiner*—David Nelms
*Assistant Examiner*—Anh Phung
*Attorney, Agent, or Firm*—Stanton C. Braden

[57] ABSTRACT

A memory circuit having a stitched architecture wherein word lines of the memory circuit comprise a low resistance conductor stitched to a gate conductor portion having a higher resistance than the low resistance conductor. The memory circuit includes an array of memory cells having thereon bit lines disposed generally along a first direction and the word lines disposed generally along a second direction substantially orthogonal to the first direction. The memory circuit also includes an array sense amplifier region disposed adjacent the array of memory cells generally along the first direction. The array sense amplifier region has therein a plurality of array sense amplifiers coupled to the bit lines. The memory circuit further includes a stitch region containing contacts for stitching the low resistance conductor with the gate conductor. The stitch region is disposed adjacent the array of memory cells generally along the second direction. There is further included a set of local data lines disposed generally along the second direction and coupled to the plurality of array sense amplifiers. There is also included a set of master data switches coupled to the set of local data lines. The master data switch is disposed in a contact-free portion of the stitch region that is adjacent to the array sense amplifier region generally along the second direction. The memory circuit further includes a set of master data lines disposed generally along the first direction and a set of master line-to-switch connectors disposed generally along the second direction for coupling the set of master data lines to the set of master data switches, wherein the set of bit lines, the set of master data lines, the low resistance conductors of the word lines, the set of local data lines, and the set of master line-to-switch connectors are formed from at least four different conductor layers of the memory circuit.

23 Claims, 3 Drawing Sheets

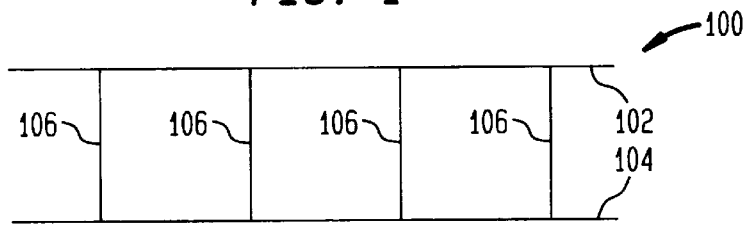
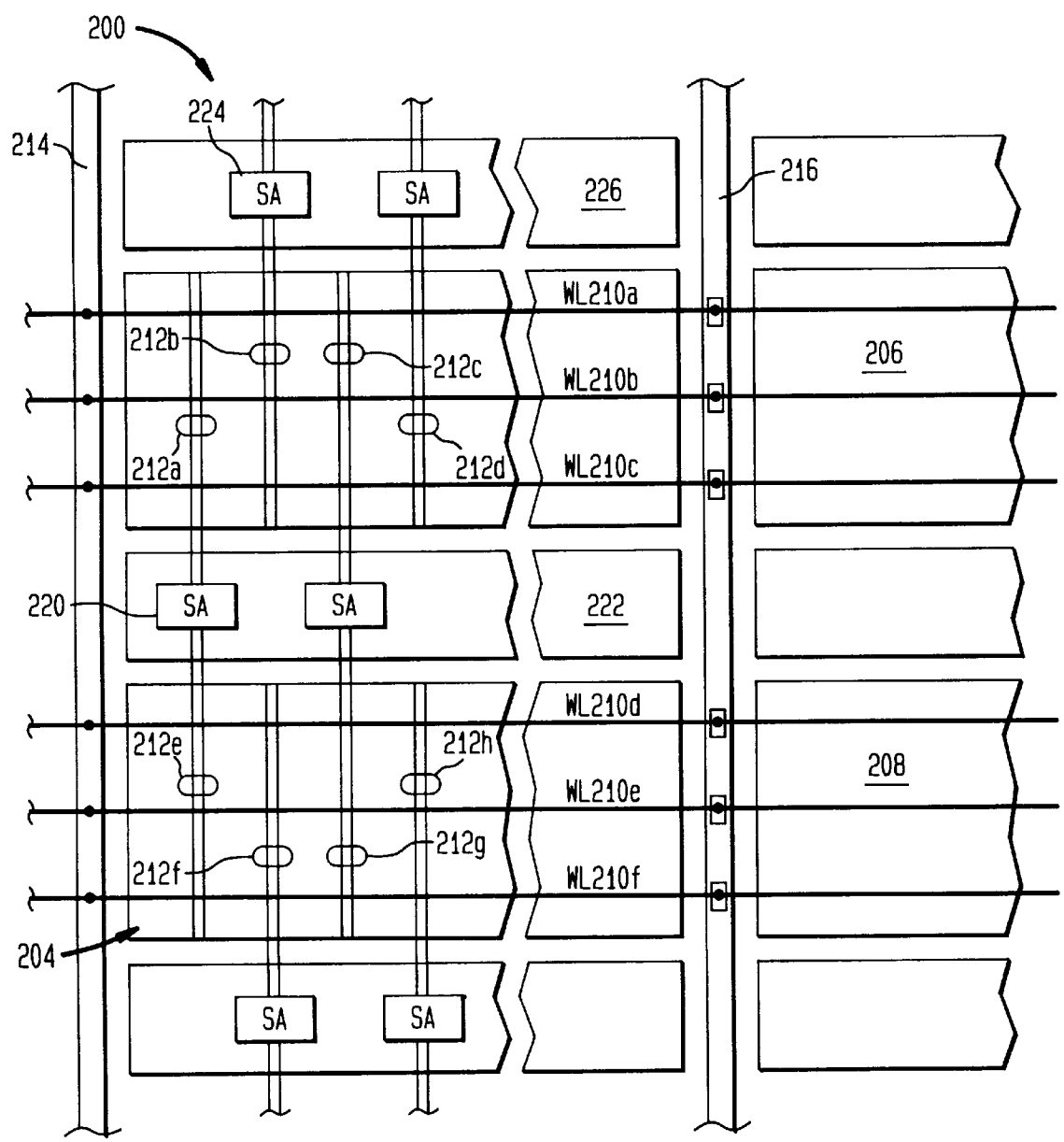

DYNAMIC RANDOM ACCESS MEMORY CIRCUIT AND METHODS THEREFOR

BACKGROUND OF THE INVENTION

The present invention relates to integrated memory circuits such as dynamic random access memory integrated circuits (DRAM), static memory circuits, or the like. More particularly, the present invention relates to an improved dynamic random access memory architecture wherein the master data switches and the connections thereto are laid out such that space usage on the chip is substantially reduced.

Memory circuits such as dynamic random access memory (DRAM) circuits have long been employed in electronic equipment such as computers. In designing DRAM circuits, the challenge has been to maximize performance (in terms of delay, power consumption, density, and the like) while reducing the size of the integrated circuit to improve performance. There is provided in the art a DRAM architecture known as a stitched word line architecture wherein the word lines are formed by stitching together a low resistance conductor (typically formed of a metal such as aluminum or copper) to a gate conductor portion by the use of interdielectric contacts.

To facilitate discussion FIG. 1 illustrates a portion of a word line 100 including a low resistance conductor 102 and a gate conductor portion 104. Low resistance conductor 102, which is typically formed of a low resistance material such as aluminum or copper or one of their alloys, is disposed above and separated from gate conductor portion 104 by a dielectric layer. Gate conductor portion 104, which may be one continuous piece or may be segmented, represents the conductor that couples to the gate of the access transistors, i.e., the transistors that control the flow of current to and from the storage cells. To couple low resistance conductor 102 to gate conductor portion 104, a plurality of contacts, or stitches 106 are shown.

The use of a stitched word line architecture increases the speed at which the potential on the word line can be switched since speed is limited by the value of the RC product of the word line as a unit. Since the sheet resistance of the material forming low resistance conductor 102 is substantially lower than the sheet resistance of the material forming the gate conductor portion, the use of low resistance conductor 102 greatly reduces the resistance (R) at the expense of little additional capacitance (C). Thus, the value of the RC product is greatly reduced, enabling an increase the switching speed of the word line.

Although the use of the stitched word line architecture advantageously improves performance, there is required on the DRAM chip a stitch region for accommodating contacts 106. To further elaborate, FIG. 2 illustrates a portion of an exemplary DRAM circuit wherein the stitched word line architecture is employed. Referring now the FIG. 2, DRAM portion 200 includes arrays of memory cells 202, 204, 206, and 208. Within an array, word lines 210 are disposed horizontally (i.e., in the X direction) in general while bit line pairs 212 are disposed substantially orthogonal to the word lines, i.e., they are disposed vertically (i.e., in the Y direction) in general.

It should be understood that while the general direction of the word lines (as well as other horizontal running structures) is typically horizontal, local variations in the general direction may occur in some DRAMs. Likewise, although the general direction of the bit lines (as well as other vertical running structures) is typically vertical, local variations may also occur. In these cases, the local intersection between a word line and a bit line may not be exactly orthogonal, as may be expected, although the general direction of a word line and the general direction of a bit line may form one. Thus, the directions discussed herein should be understood in the general sense and are not intended to limit the inventions to absolute horizontal or vertical directions. It should also be understood that each of word lines 210 represents a stitched unit wherein a low resistance conductor is stitched to an underlying gate conductor portion in the manner discussed earlier. Although only some exemplary word lines and bit line pairs are shown in FIG. 2, it should also be understood that an array may have as many word lines and bit line pairs as needed.

The contacts (e.g., contacts 106 of FIG. 1) employed to stitch the low resistance conductor of a word line to its gate conductor portion are disposed in the stitch regions which are located adjacent to the arrays generally in the horizontal (or X) direction. With reference to FIG. 2, the contacts for stitching the low resistance conductor to the gate conductor portion of the word lines are located in stitch regions 214, and 216, which are disposed between adjacent columns of arrays.

The bit line pairs 212 of FIG. 2 are provided in pairs in accordance with the folded bit line architecture that is well known to those skilled in the art of DRAM design. Generally speaking, in the folded bit line architecture, two bit lines are employed to sense the charged stored in a memory cell of the DRAM. In preparation for reading the stored charge, both the true and complement bit lines are precharged to a predefined level. Since the word line is connected to the gate of the access transistor that controls the storage cell, raising the word line connects the storage cell to the true bit line. The stored charge will either increase or decrease the precharged potential already existing on true bit line.

An array sense amplifier coupling to both the true and compliment bit lines would then compare the potential of the true bit line to that of the compliment bit line (which is unconnected to the storage cell and therefore does not have its potential changed by the charge in the storage cell). The result of the comparison is then provided through additional circuitry (which will be described further in connection with FIG. 3 herein) to the pins of the DRAM circuit to enable an external circuit to ascertain the logic value stored in the storage cell.

With reference to FIG. 2, the array sense amplifiers are disposed in the array sense amplifier regions which are disposed above and below each array. In the example of FIG. 2, an interleaved sense amplifier architecture is employed wherein the sense amplifiers employed for sensing the potentials on adjacent bit line pairs are located at opposite ends of an array. By way of example, sense amplifier 220, which is employed to detect the potentials on bit line pair 212a, is disposed in sense amplifier region 222. Sense amplifier 224, which is employed to sense the potentials on adjacent bit line pair 212b, is disposed in sense amplifier region 226. As can be seen in FIG. 2, sense amplifier regions 222 and 226 are disposed at opposite ends of array 202. The interleaved sense amplifier architecture is well known in the art and will not be further elaborated here.

The use of an interleaved sense amplifier architecture advantageously increases the sense amplifier pitch relative to the bit line pitch, thereby providing more room in each sense amplifier region to implement the sense amplifiers. To reduce the number of sense amplifiers required per DRAM circuit, each sense amplifier is typically connected to the two bit line pairs of the two arrays adjacent to it and multiplexed between the two bit line pairs as needed. By way of example, sense amplifier 220 is coupled to both bit line pairs 212a and 212e, and is multiplexed between these two bit line pairs to enable sense amplifier 220 to service the sensing need of both of these bit line pairs. In this manner, the number of sense amplifiers required per DRAM circuit may be reduced by approximately half.

As mentioned in connection with FIG. 2, additional circuitry is typically required to output the logic state sensed by the array sense amplifiers (e.g., sense amplifiers 224 of FIG. 2) to the off-chip driver (which provides that sensed logic state to the pin of the DRAM IC to be read by the requesting external circuit). One implementation of the aforementioned additional circuitry is depicted in FIG. 3. Referring now to FIG. 3, there is shown a pair of bit lines which include a true bit line 302 and a compliment bit line 304. As mentioned earlier, an array sense amplifier may be employed to compare the potential on true bit line 302 with the potential on compliment bit line 304 to ascertained the charge stored in the memory cell accessed (which modifies the potential on true bit line 302). The result of the comparison is output by array sense amplifier 306 to local data lines 308 and 310. Local data line 308 represents the true data line and local data line 310 represents its compliment.

A pair of master data switches 312 and 314 couple to local data lines 308 and 310 to master data lines 316 and 318. As in the case of the local data lines, master data line 316 represents the true master data line while master data line 318 represents its compliment. Master data switches 312 and 314 may be implemented by, for example, n-channel complimentary metal oxide (CMOS) transistors although they may well be implemented by other types of transistor technologies. The combination of local data lines 308/310 and master data lines 316/318 carries the result ascertained by array sense amplifier 306 outside of the array area. As shown in FIG. 3, master data lines 316 and 318 are input into a master sense amplifier 320, which compares the potentials on master data lines 316 and 318, to output data on a R/W data line 322 to be furnished to the off-chip driver.

The provision of master data switches 312 and 314 is advantageous since multiple pairs of local data lines are typically coupled to any given pair of master data line. By appropriately manipulating the master data switches coupled to a given pair of master data lines, it is possible then to select the appropriate pair of local data lines for coupling to the pair of master data lines while deselecting (i.e., decoupling) the other pairs of local data lines from that pair of master data lines. In this manner, the capacitance associated with the conductive path between the array sense amplifier (e.g., array sense amplifier 306) and the master sense amplifier (e.g., master sense amplifier 320) is reduced since the inactive pairs of local data lines are not selected and are thus decoupled from the pair of master data lines that forms part of the conductive path.

It should be appreciated many pairs of local data lines, master data lines, and master data switches may be required in a given DRAM circuit. As such, the circuitry of FIG. 3 needs to be accommodated and laid out such that minimal additional space is required on the integrated circuit. In particular, it remains a challenge to lay out the local data lines, the master data switches, the master data lines, and the connections between these components such that both layout complexity and space usage is reduced.

SUMMARY OF THE INVENTION

The invention relates, in one embodiment, to a memory circuit having a stitched architecture wherein word lines of the memory circuit comprise a low resistance conductor stitched to a gate conductor portion having a higher resistance than the low resistance conductor. The memory circuit includes an array of memory cells having thereon bit lines disposed generally along a first direction and the word lines disposed generally along a second direction substantially orthogonal to the first direction. The memory circuit also includes an array sense amplifier region disposed adjacent the array of memory cells generally along the first direction. The array sense amplifier region has therein a plurality of array sense amplifiers coupled to the bit lines. The memory circuit further includes a stitch region containing contacts for stitching the low resistance conductor with the gate conductor. The stitch region is disposed adjacent the array of memory cells generally along the second direction. There is further included a set of local data lines disposed generally along the second direction and coupled to the plurality of array sense amplifiers. There is also included a set of master data switches coupled to the set of local data lines. The master data switch is disposed in a contact-free portion of the stitch region that is adjacent to the array sense amplifier region generally along the second direction. The memory circuit further includes a set of master data lines disposed generally along the first direction and a set of master line-to-switch connectors disposed generally along the second direction for coupling the set of master data lines to the set of master data switches, wherein the set of bit lines, the set of master data lines, the low resistance conductors of the word lines, the set of local data lines, and the set of master line-to-switch connectors are formed from at least four different conductor layers of the memory circuit.

In another embodiment, the invention relates to a method of fabricating a memory circuit having a stitched architecture wherein word lines of the memory circuit comprise a low resistance conductor stitched to a gate conductor portion having a higher resistance than the low resistance conductor. The method includes forming an array of memory cells having thereon bit lines disposed generally along a first direction and the word lines disposed generally along a second direction substantially orthogonal to the first direction. The method also includes providing a plurality of array sense amplifiers disposed in an array sense amplifier region adjacent the array of memory cells generally along the first direction. The plurality of array sense amplifiers are coupled to the bit lines. The method further includes providing a stitch region containing contacts for stitching the low resistance conductor with the gate conductor. The stitch region is disposed adjacent the array of memory cells generally along the second direction.

There is included providing a set of local data lines disposed in the array sense amplifier region and generally along the second direction. The set of local data lines is coupled to the plurality of array sense amplifiers. There is also included providing a set of master data switches disposed in a contact-free portion of the stitch region that is adjacent the array sense amplifier region generally along the second direction. The set of master data switches is coupled to the set of local data lines. Additionally, there is included providing a set of master data lines disposed generally along the first direction in the array of memory cells. Furthermore, there is included providing a set of master line-to-switch connectors generally along the second direction for coupling the set of master data lines to the set of master data switches, wherein the set of bit lines, the set of master data lines, the low resistance conductors of the word lines, the set of local data lines, and the set of master line-to-switch connectors are formed from at least four different conductor layers of the memory circuit.

These and other features of the present invention will be described in more detail below in the detailed description of the invention and in conjunction with the following figures.

BRIEF DESCRIPTION OF THE DRAWINGS

The present invention will be readily understood by the following detailed description in conjunction with the accompanying drawings, wherein like reference numerals designate like structural elements, and in which:

FIG. 1 illustrates a portion of a word line of a DRAM having the stitched word line architecture, including a low resistance conductor coupled to a gate conductor portion by interdielectric contacts.

To further elaborate, FIG. 2 illustrates a portion of an exemplary DRAM circuit wherein the stitched word line architecture is employed, including the stitch regions in between the arrays.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known structures and/or process steps have not been described in detail in order to not unnecessarily obscure the present invention.

In accordance with one aspect of the present invention, it is advantageously recognized that there are portions within the stitch region that are free of stitches, or contacts, due to the absence of the word lines. In particular, it is advantageously recognized that the contact-free portions of the stitch regions are generally located adjacent to the row of sense amplifiers, i.e., adjacent to the sense amplifier region of each array, generally along the horizontal (or X) direction. Further, it is advantageously recognized that the master data switches may be disposed within the contact-free portions of the stitch regions to minimize space usage on the chip.

In accordance with one aspect of the invention, there is provided an improved DRAM architecture wherein an additional conductor layer is provided to accommodate the connections between the master data lines (which are located in the array region and/or the stitch region) and the master data switches (which are located in the contact-free portions of the stitch regions) to reduce layout complexity. In accordance with this aspect of the invention, the local data lines are permitted to run generally in the horizontal direction (or X) in the sense amplifier regions while the master data lines are laid out in a different conductor layer generally in the vertical direction (or Y) at least partially in the arrays. To couple the master data lines (which are laid out vertically through the arrays) with the master data switches (which are disposed in the contact-free portion of the stitch regions), there are provided a plurality of master line-to-switch connectors, which are formed from yet another conductor layer and are disposed generally in the horizontal (or X) direction. Typically, the master line-to-switch connectors are disposed in the stitch regions. In a preferred embodiment, the bit lines, the local data lines, the master data lines, and the master line-to-switch connectors are formed from four different conductor layers of the DRAM circuit. It has been found that such layout substantially reduces the layout complexity associated with placing the master data switches in the contact-free portions of the stitch regions.

Figure 3:
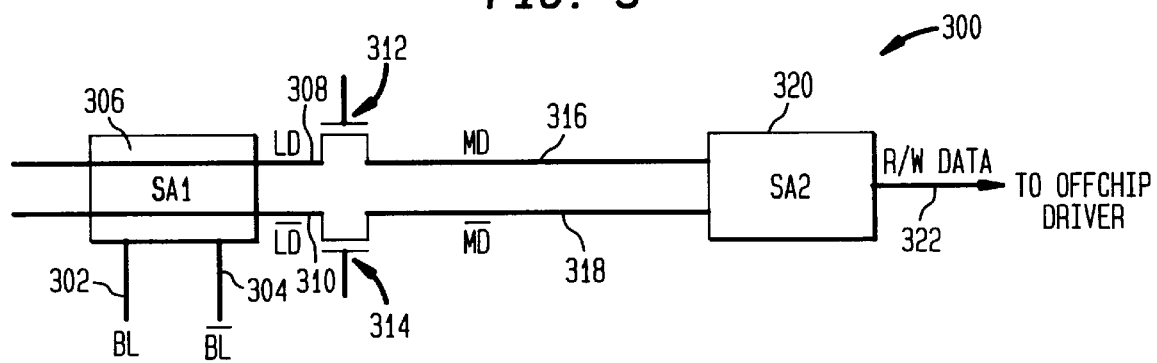
FIG. 3 depicts a part of the conducting path employed to transmit the stored value in a memory cell off chip, including the local data lines, the master data switches, and the master data lines.
Figure 4:
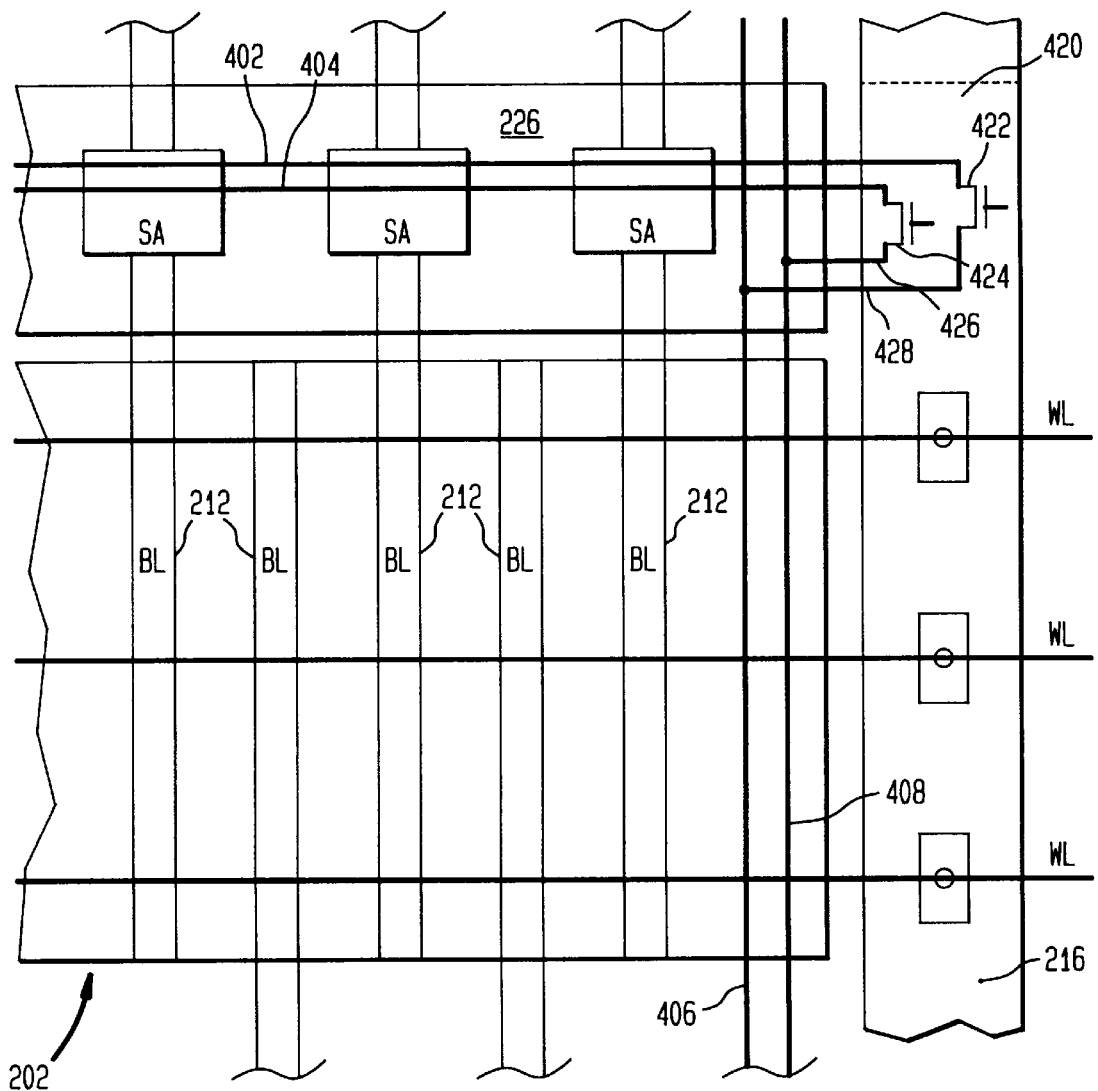
FIG. 4 illustrates, in accordance with one aspect of the present invention, a portion of a DRAM circuit wherein the master data switches are implemented in the contact-free portions of the stitch regions and wherein the master line-to-switch connectors are provided to couple the master data switches to the master data lines.

To further discuss the features and advantages of the present invention, FIG. 4 depicts a portion of a DRAM circuit, including array 202 of FIG. 2, sense amplifier region 226 and stitch region 216. It should be appreciated that while the inventions are described with specific references to DRAMs herein to simplify the discussion, it should be kept in mind, however, that the inventions apply to memory circuits in general and are not intended to be limiting to DRAMs. In view of the discussions herein, the adaptation of the techniques described herein to other types of memory technologies (e.g., static memory) is within the skills of those skilled in the art.

Array 202, sense amplifier region 226, and stitch region 216 have been discussed earlier in connection with FIG. 2. In sense amplifier region 226, there is shown a pair of local data lines 402 and 404, which are laid out generally in the horizontal (or X) direction in FIG. 4. Although only one pair of local data lines is shown to facilitate discussion, it should be understood that multiple pairs of local data lines may be provided. A pair of master data lines 406 and 408 is shown laid out generally in the vertical (or Y) direction parallel to bit line pair 212 of array 202. Again, although only one pair of master data lines is shown to facilitate discussion, it should be understood that multiple pairs of master data lines may be disposed in array 202, either at the edge of the array or further toward the center of the array itself. By way of example, an exemplary array may have 512 bit line pairs and 8 master data line pairs disposed in the array.

As shown in FIG. 4, there exists a contact-free portion 420 of stitch region 216 within which there are no stitches or contacts since there are no word lines running in the sense amplifier region. Although not shown in FIG. 4, there are typically dummy bit lines on both sides of the stitch region (e.g., stitch region 216) for lithography purposes. Since the dummy bit lines are provided mainly to ensure that the existence of stitch region 216 does not disturb the local lithography environment surrounding the active bit lines, these dummy bit lines are inactive and do not need any sense amplifier. In this contact-free portion 420, master data switches 422 and 424 are implemented.

It should be appreciated that although it appears that each array may have up to four contact-free portions, a given contact-free portion is actually shared in common by the neighboring arrays. Thus the total number of contact-free portions in a DRAM is typically fewer than four times the number of arrays.

The size of each stitch free portion depends on the particulars of a given DRAM circuit. In one exemplary DRAM circuit, the sense amplifier region may have a height of about 25 microns while the stitch region may have a width of about 2 microns, yielding a contact-free portion having an area roughly 50 (25×2) square microns.

The local data lines (e.g., local data lines 402 and 404) may be connected to the master data switches (e.g., 422 and 424) by contacts though the dielectric layer that separates the active region of the master data switches from the local data lines. To connect master data switches 422 and 424 to respective master data lines 406 and 408, there are provided, in accordance with a preferred embodiment of the present invention, master line-to-switch connectors 426 and 428, which are disposed generally in the horizontal (or X) direction in FIG. 4. Although master line-to-switch connectors 426 and 428 are shown offset from local data lines 402 and 404 in the vertical (or Y) direction in FIG. 4, such is not a requirement since the master line-to-switch connectors and the local data lines are implemented in different conductor layers and may be laid directly on top of one another. To reduce coupling noise, however, the master line-to-switch connectors may be offset from the local data lines in the vertical (or Y) direction as shown in FIG. 4 using any of the available and suitable layers of conductors on the DRAM circuit.

In one embodiment, the bit lines (212), the master data lines (406 and 408), the local data lines (402 and 404), and the master line-to-switch connectors (426 and 428) are preferably implemented in four different conducting (e.g., metal) layers of the DRAM circuit. Since the master line-to-switch connectors are accommodated in an additional conducting layer from those implementing the bit lines, the master data lines, and the local data lines, layout complexity is greatly reduced. Preferably (but not necessarily), the master line-to-switch connectors are implemented in a conducting layer that is adjacent to the conducting layer employed to implement the local data lines. By way of example, the bit lines may be implemented in the first metal layer (M0), and the local data lines may be implemented in either M1 or M2. The master line-to-switch connectors may be implemented in the other metal layer of the M1/M2 set. In this example, the master data lines may be implemented in M3 while the low resistance conductors of the word lines may be implemented in either M1 or M2.

Figure 5:
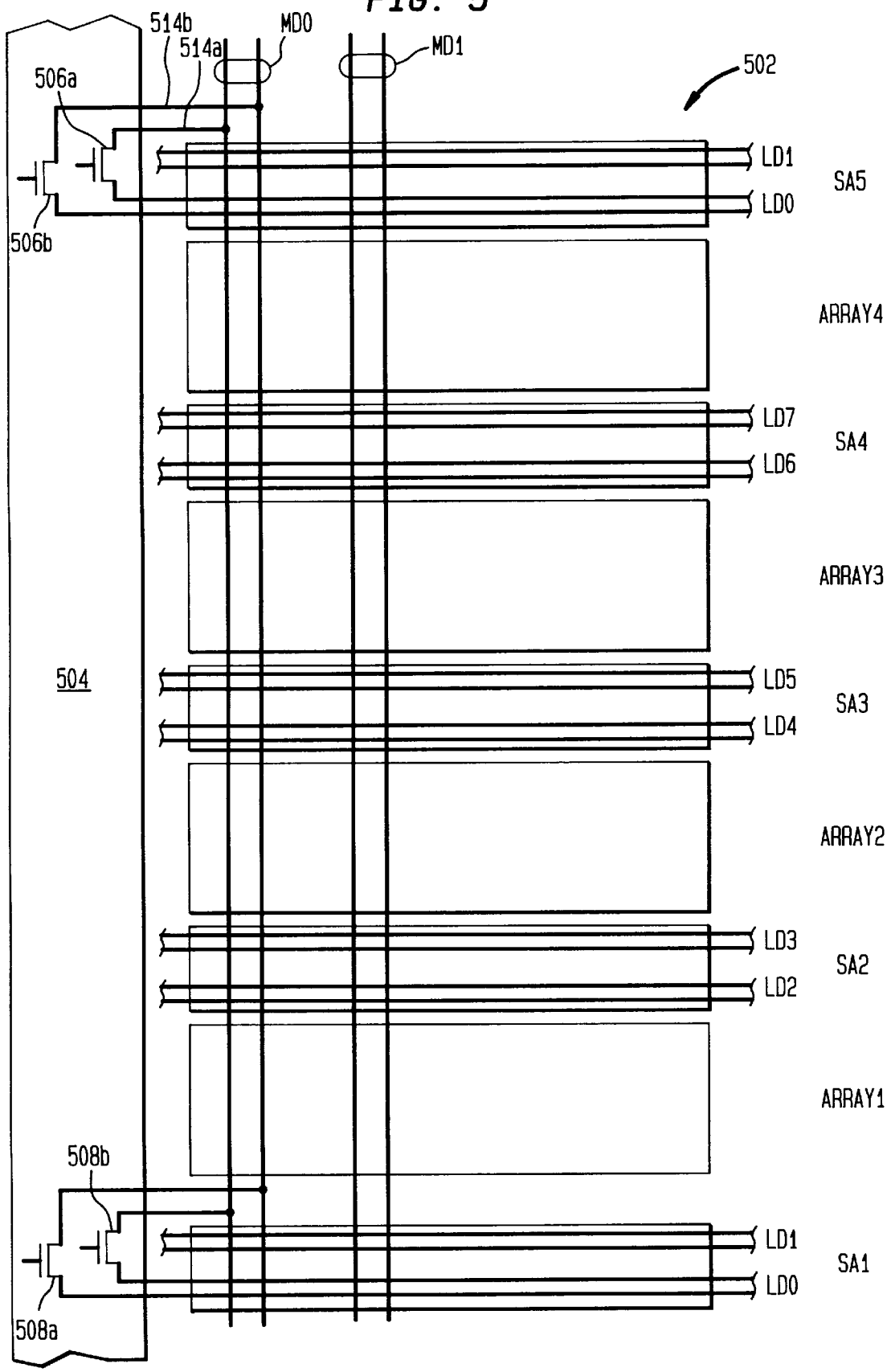
FIG. 5 illustrates, in accordance with one embodiment of the invention, the relationship between the local data lines, the master data lines, the master data switches, and the master line-to-switch connectors in an exemplary DRAM segment.

FIG. 5 illustrates, in accordance with one embodiment of the present invention, the relationship between the local data lines, the master data lines, the master data switches, and the master line-to-switch connectors in an exemplary DRAM segment. In FIG. 5, an exemplary DRAM segment 502 is shown, which includes four arrays and their associated five sense amplifier regions, all disposed generally in the vertical (Y) direction. Exemplary DRAM segment 502 may be apart of a DRAM unit comprising a greater number arrays. In such a DRAM unit, DRAM segment 502 may be duplicated in the horizontal (X) direction as well as the vertical (Y) direction to form the DRAM unit.

In DRAM segment 502, ten exemplary pairs of local data lines are shown, with two pairs of local data lines being provided per sense amplifier region. Note that local data line pair LD0 is repeated in both sense amplifier region 1 and sense amplifier region 5, and so is local data line pair LD1. DRAM segment 502 may also have, for example, 8 pairs of master data lines of which 2 pairs (MD0 and MD1) are shown. Each pair of master data lines includes a true master data line and a complement master data line as discussed earlier. The master data switches are disposed in the contact-free portions of stitch region 504 as shown.

As shown, master data line pair MD0 are connected to both pairs of local data lines LD0 (the two pairs of local data lines are associated with sense amplifier region 1 and sense amplifier region 5) through master data switches 506a/506b and 508a/508b. With reference to master data switches 506a/506b, these master data switches are shown coupled to master data lines MD0 by the master line-to-switch connectors 514a/514b, which are shown disposed in the general horizontal (or X) direction in FIG. 5. As mentioned earlier, the master line-to-switch connectors are preferably implemented in the array sense amplifier region. The bit lines, the local data lines, the master data lines, and the master line-to-switch connectors are preferably implemented in four different conductor (e.g., metal) layers of the DRAM circuit, i.e., there are at least four conductor layers in the DRAM in accordance with this embodiment.

Although not shown, the two pairs of local data lines LD1 in sense amplifier region 1 and sense amplifier region 5 may be coupled to the pair of master data lines MD1 in a similar manner through master data switches and master line-to-switch connectors. It should be appreciated that other pairs of local data lines may be coupled to their master data lines in an analogous manner. In general, the master data switches associated with a given DRAM unit may be disposed in one of the stitch regions bordering the DRAM unit, in both stitch regions that border the DRAM unit, or be distributed throughout the various stitch regions of the DRAM unit.

As mentioned earlier, although multiple pairs of local data lines may be coupled to a single pair of master data lines, the master data switches may be appropriately controlled to select only the active pair of local data lines and to deselect (thereby decouple) the pairs of local data lines that are inactive from the conductive path between the active array sense amplifier (which is coupled to the active bit line pair being employed to read the stored charge) and the master sense amplifier (which is coupled to the off-chip driver) in order to reduce the capacitance thereof and to improve performance.

As can be appreciated from the foregoing, the invention advantageously allows, in accordance with one aspect, the master data switches to be located in the portions of the stitch regions which heretofore have not been employed for such a purpose. With the advantageous recognition that there are no stitches in certain portions of the stitch region and that these contact-free portions of the stitch regions already exist on the DRAM IC and may be employed to implement the master data switches, the invention advantageously accommodates the master data switches in a manner that substantially minimizes the need for additional chip area (since no additional space is required in the sense amplifier region and a previously unused portion of the chip, i.e., the contact-free portion of the stitch region, is employed instead). In this manner, the overall size of the resultant IC may be kept small, which increases DRAM density and operating speed, and reduces the production costs.

By accommodating the master line-to-switch connectors in a conductor layer that is different from the conductor layers employed to implement the bit lines, the local data lines, and the master data lines, the invention advantageously makes it possible to place the master data switches in the aforementioned contact-free portions of the stitch regions yet permits them to be connected to the vertically running master data lines in a manner that minimizes layout complexity. This reduction in layout complexity contributes to a further reduction in the production costs of the resultant DRAM IC.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A memory circuit having a stitched architecture wherein word lines of said memory circuit comprise a low resistance conductor stitched to a gate conductor portion having a higher resistance than said low resistance conductor, comprising:

an array of memory cells having thereon bit lines disposed generally along a first direction and said word lines disposed generally along a second direction substantially orthogonal to said first direction;

an array sense amplifier region disposed adjacent said array of memory cells generally along said first direction, said array sense amplifier region having therein a plurality of array sense amplifiers coupled to said bit lines;

a stitch region containing contacts for stitching said low resistance conductor with said gate conductor, said stitch region being disposed adjacent said array of memory cells generally along said second direction;

a set of local data lines disposed generally along said second direction and coupled to said plurality of array sense amplifiers;

a set of master data switches coupled to said set of local data lines, said master data switch being disposed in a contact-free portion of said stitch region that is adjacent to said array sense amplifier region generally along said second direction;

a set of master data lines disposed generally along said first direction; and a set of master line-to-switch connectors disposed generally along said second direction for coupling said set of master data lines to said set of master data switches, wherein said set of bit lines, said set of master data lines, said low resistance conductors of said word lines, said set of local data lines, and said set of master line-to-switch connectors are formed from at least four different conductor layers of said memory circuit.

2. The memory circuit of claim 1 wherein said set of bit lines is formed from a first conductor layer, said set of master data lines is formed from a second conductor layer different from said first conductor layer, said low resistance conductors of said word lines, said set of local data lines, and said set of master line-to-switch connectors are formed from a third conductor layer and a fourth conductor layer that are different from said first conductor layer and said second conductor layer.

3. The memory circuit of claim 2 wherein said set of master line-to-switch connectors and said set of local data lines are disposed in two adjacent conductor layers.

4. The memory circuit of claim 1 wherein said set of master line-to-switch connectors and said set of local data lines are disposed in two adjacent conductor layers.

5. The memory circuit of claim 1 wherein said set of master line-to-switch connectors are disposed directly above said set of local data lines.

6. The memory circuit of claim 1 wherein said set of master line-to-switch connectors are offset from said set of local data lines generally along said first direction.

7. The memory circuit of claim 1 further comprising a set of master sense amplifiers coupled to said set of master data lines.

8. The memory circuit of claim 1 wherein said set of local data lines and said set of master line-to-switch connectors are disposed within said array sense amplifier region.

9. The memory circuit of claim 8 wherein said set of master data lines are disposed in said array.

10. A method of fabricating a memory circuit having a stitched architecture wherein word lines of said memory circuit comprise a low resistance conductor stitched to a gate conductor portion having a higher resistance than said low resistance conductor, said method comprising:

forming an array of memory cells having thereon bit lines disposed generally along a first direction and said word lines disposed generally along a second direction substantially orthogonal to said first direction;

providing a plurality of array sense amplifiers disposed in an array sense amplifier region adjacent said array of memory cells generally along said first direction, said plurality of array sense amplifiers being coupled to said bit lines;

providing a stitch region containing contacts for stitching said low resistance conductor with said gate conductor, said stitch region being disposed adjacent said array of memory cells generally along said second direction;

providing a set of local data lines disposed in said array sense amplifier region and generally along said second direction, said set of local data lines being coupled to said plurality of array sense amplifiers;

providing a set of master data switches disposed in a contact-free portion of said stitch region that is adjacent said array sense amplifier region generally along said second direction, said set of master data switches being coupled to said set of local data lines;

providing a set of master data lines disposed generally along said first direction in said array of memory cells; and providing a set of master line-to-switch connectors generally along said second direction for coupling said set of master data lines to said set of master data switches, wherein said set of bit lines, said set of master data lines, said low resistance conductors of said word lines, said set of local data lines, and said set of master line-to-switch connectors are formed from at least four different conductor layers of said memory circuit.

11. The method of claim 10 wherein said set of bit lines is formed from a first conductor layer, said set of master data lines is formed from a second conductor layer different from said first conductor layer, said low resistance conductors of said word lines, said set of local data lines, and said set of master line-to-switch connectors are formed from a third conductor layer and a fourth conductor layer that are different from said first conductor layer and said second conductor layer.

12. The method of claim 11 wherein said set of master line-to-switch connectors and said set of local data lines are disposed in two adjacent conductor layers.

13. The method of claim 10 wherein said set of master line-to-switch connectors and said set of local data lines are disposed in two adjacent conductor layers.

14. The method of claim 10 wherein said set of master line-to-switch connectors are disposed directly above said set of local data lines.

15. The method of claim 10 wherein said set of master line-to-switch connectors are offset from said set of local data lines generally along said first direction.

16. The method of claim 10 further comprising providing a set of master sense amplifiers coupled to said set of master data lines.

17. The method of claim 10 wherein said memory circuit is a dynamic random access memory circuit.

18. A memory circuit having a stitched architecture wherein word lines of said memory circuit comprise a low resistance conductor stitched to a gate conductor portion having a higher resistance than said low resistance conductor, said memory circuit further having an array of memory cells having thereon bit lines disposed generally along a first direction and said word lines disposed generally along a second direction substantially orthogonal to said first direction and an array sense amplifier region disposed adjacent said array of memory cells generally along said first direction, said array sense amplifier region having therein a plurality of array sense amplifiers coupled to said bit lines, said memory circuit further having a stitch region containing contacts for stitching said low resistance conductor with said gate conductor, said stitch region being disposed adjacent said array of memory cells generally along said second direction, said memory circuit comprising:

- a set of local data lines disposed generally along said second direction and coupled to said plurality of array sense amplifiers;
- a set of master data lines disposed generally along said first direction; and
- connectors means disposed generally along said second direction for coupling with said set of master data lines;
- switching means coupled to said set of local data lines and said set of connector means for selectively coupling electrically said set of local data lines with said set of master data lines, said switching means being disposed in a contact-free portion of said stitch region that is adjacent said array sense amplifier region generally along said second direction, wherein said set of bit lines, said set of master data lines, said low resistance conductors of said word lines, said set of local data lines, and said set of master line-to-switch connectors are formed from at least four different conductor layers of said memory circuit.

19. The memory circuit of claim 18 wherein said set of bit lines is formed from a first conductor layer, said set of master data lines is formed from a second conductor layer different from said first conductor layer, said low resistance conductors of said word lines, said set of local data lines, and said connector means are formed from a third conductor layer and a fourth conductor layer that are different from said first conductor layer and said second conductor layer.

20. The memory circuit of claim 19 wherein said connector means and said set of local data lines are disposed in two adjacent conductor layers.

21. The memory circuit of claim 18 wherein said connector means and said set of local data lines are disposed in two adjacent conductor layers.

22. The memory circuit of claim 18 wherein said set of local data lines and said connector means are disposed within said array sense amplifier region.

23. The memory circuit of claim 22 wherein said set of master data lines are disposed in said array.

* * * * *